(12) United States Patent
Babb et al.

(10) Patent No.: US 11,121,211 B2
(45) Date of Patent: Sep. 14, 2021

(54) FABRICATION OF LATERAL SUPERJUNCTION DEVICES USING SELECTIVE EPITAXY

(71) Applicant: The Texas A&M University System, College Station, TX (US)

(72) Inventors: Michael Everett Babb, Bryan, TX (US); Harlan Rusty Harris, College Station, TX (US)

(73) Assignee: The Texas A&M University System, College Station, TX (US)

( * ) Notice: Subject to any disclaimer, the term of this patent is extended or adjusted under 35 U.S.C. 154(b) by 0 days.

(21) Appl. No.: 16/642,283

(22) PCT Filed: Sep. 28, 2018

(86) PCT No.: PCT/US2018/053572
§ 371 (c)(1),
(2) Date: Feb. 26, 2020

(87) PCT Pub. No.: WO2019/068001
PCT Pub. Date: Apr. 4, 2019

(65) Prior Publication Data
US 2021/0036103 A1    Feb. 4, 2021

Related U.S. Application Data

(60) Provisional application No. 62/566,290, filed on Sep. 29, 2017.

(51) Int. Cl.
*H01L 29/06* (2006.01)
*H01L 21/02* (2006.01)
(Continued)

(52) U.S. Cl.
CPC ...... *H01L 29/0634* (2013.01); *H01L 21/0242* (2013.01); *H01L 21/0254* (2013.01); *H01L 21/02381* (2013.01); *H01L 21/02645* (2013.01); *H01L 21/28575* (2013.01); *H01L 21/308* (2013.01); *H01L 21/30612* (2013.01); *H01L 29/2003* (2013.01); *H01L 29/452* (2013.01); *H01L 29/66204* (2013.01); *H01L 29/861* (2013.01)

(58) Field of Classification Search
None
See application file for complete search history.

(56) References Cited

U.S. PATENT DOCUMENTS 7,285,823 B2 * 10/2007 Loechelt ............. H01L 29/0634
257/341
7,411,266 B2 * 8/2008 Tu ....................... H01L 29/0634
257/492

(Continued)

*Primary Examiner* — Andres Munoz
(74) *Attorney, Agent, or Firm* — Winstead PC

(57) ABSTRACT

A lateral superjunction includes a substrate layer, a selective epitaxy layer deposited on the substrate layer, a trench formed into the selective epitaxy layer to expose a portion of the substrate layer, a first layer of semiconductor deposited in the trench, a second layer of semiconductor deposited adjacent to the first layer, and a first end layer of semiconductor deposited adjacent to the first layer of semiconductor and a second end layer of semiconductor deposited adjacent to the second layer of semiconductor.

8 Claims, 15 Drawing Sheets

(51) Int. Cl.

*H01L 21/285* (2006.01)
*H01L 21/306* (2006.01)
*H01L 21/308* (2006.01)
*H01L 29/20* (2006.01)
*H01L 29/45* (2006.01)
*H01L 29/66* (2006.01)
*H01L 29/861* (2006.01)

(56) References Cited

U.S. PATENT DOCUMENTS

| | | |
|---|---|---|
| 8,785,975 B2 | 7/2014 | Nie et al. |
| 9,287,371 B2 | 3/2016 | Moens et al. |
| 9,324,784 B2 * | 4/2016 | Roig Guitart ....... H01L 29/0653 |
| 2005/0242411 A1 * | 11/2005 | Tso ..................... H01L 29/872 |
| | | 257/480 |
| 2012/0018800 A1 | 1/2012 | Kim |
| 2017/0338302 A1 * | 11/2017 | Hsieh .................. H01L 29/0878 |
| 2018/0226471 A1 * | 8/2018 | Hille .................. H01L 29/7802 |

* cited by examiner

FABRICATION OF LATERAL SUPERJUNCTION DEVICES USING SELECTIVE EPITAXY

CROSS-REFERENCES TO RELATED APPLICATIONS

This application claims the benefit of priority to and incorporates by reference the entire disclosure of U.S. Provisional Patent Application No. 62/566,290 filed on Sep. 29, 2017.

BACKGROUND

Technical Field

The present disclosure relates generally to the manufacture of improved (i.e., increased reliability and decreased cost) power electronics devices capable of handling high voltage with low on resistances. For example, and not by way of limitation, the present disclosure relates to fabrication of lateral superjunctions using selective epitaxy.

History of Related Art

Work has been done on superjunctions but, to date, no one has provided low-defect (e.g., below $10^6$ cm$^{-2}$) lateral superjunction GaN devices grown on a relatively inexpensive (silicon or sapphire) substrate. Current devices are unable to achieve high breakdown voltages at low on-resistances.

BRIEF SUMMARY

In an exemplary aspect, a lateral superjunction includes a substrate having a trench; a first doped GaN layer deposited within the trench and disposed on a surface of the substrate; a plurality of doped GaN layers disposed on the first GaN layer and disposed on each of the plurality of doped GaN layers; a first doped GaN sidewall structure disposed on the surface of the substrate and adjacent to the plurality of doped GaN layers; and a second doped GaN sidewall structure disposed on the surface of the substrate.

In another exemplary aspect, a method of preparing a lateral superjunction includes: 1) selecting a substrate and nucleation layers that favor GaN growth; 2) performing selective epitaxy to form alternating p/n layers in-situ; 3) etching GaN film to define superjunction device dimensions; 4) Regrow p+ and n+ ohmic contact regions; and 5) depositing ohmic contacts (metals) to p+ and n+ regrown regions.

Aspects of the disclosure can be implemented using standard semiconductor process equipment. By way of example, an illustrative method of forming a superjunction includes the following steps:

1) selecting a substrate (e.g., silicon or sapphire) on which to deposit a layer of GaN;
2) depositing (grow epitaxially) a high quality GaN buffer layer;
3) depositing a selective epitaxy mask;
4) patterning a selective epitaxy mask to achieve an aspect ratio of at least one to trap defects that occur during growth in the opening;
5) growing alternating layers of p-type and n-type semiconductor;
6) depositing a masking layer to act as a hard mask during a subsequent etching process;
7) etching areas of GaN using a wet or dry etch to achieve a desired superjunction device structure;
8) removing the hard mask and/or depositing a new mask layer to allow for the p+ or n+ growth to happen from a sidewall of the superjunction structure;
9) repeating the previous step for either the p+ or n+ layer; and
10) performing ohmic contact metallization to the p+ and n+ layer to complete device fabrication.

In some aspects, a method of producing a lateral superjunction includes the steps below:

1) Selecting a wafer substrate (e.g., silicon, sapphire, silicon carbide, GaN, Ga$_2$O$_3$, GaAs, SiO$_2$, etc.).
2) Depositing layer(s) material to act as a nucleation site for subsequent selective epitaxy (e.g., deposit AlN, GaN, InN or any of combination of the three). Thickness and composition are highly dependent on diameter of substrate. In some aspects, this step may be omitted if the substrate obtained in step one works as a good nucleation site for the selective epitaxy in the following steps (e.g., bulk GaN substrates). For example, typically on silicon substrates, AlN is deposited directly on the silicon, then graded Al$_x$Ga1-xN buffer layers are deposited on top of the AlN, and finally a GaN layer is deposited on top of the graded Al$_x$Ga1-xN. This is done to manage thermal and lattice mismatch between the substrate and the GaN layer. In some aspects, the final "starting material" before selective epitaxy is comprised of the following layers: bulk silicon substrate/AlN/Al$_x$Ga1-xN/GaN.
3) Depositing, on the starting material, an amorphous layer using physical vapor deposition (PVD) or chemical vapor deposition (CVD) that will act as a mask during the selective epitaxy step. Thickness of this layer can vary. In some aspects, the thickness can be between 10 nanometers to 10 microns. In some aspects, metals can be used as a selective epitaxy mask. While metals are more polycrystalline than amorphous, metals can provide the selective nature of deposition in subsequent epitaxy steps.
4) Forming, using patterning techniques (e.g., optical lithography, nano-imprint lithography, electron beam lithography, etc.), an opening in the amorphous layer described in the previous step.
5) Inserting the wafer substrate into deposition tool to form superjunction layers. Though GaN-based superjunctions are discussed in this illustrative example, materials other than GaN can be used. For example, other acceptable materials include GaAs, SiC, InN, AlN, Ga$_2$O$_3$ and any other semiconductor that can be doped n-type and p-type. Suitable deposition tools include MOCVD, MBE, HYPE, Evaporation, Sputter, LPE, and various other PVD or CVD techniques.
6) Depositing, in-situ, alternating layers of p-type and n-type semiconductors. Layering can begin with either p-type or n-type material, but we should not restrict ourselves to this example. The number of layers, thickness and doping density of each layer depends on the application.
7) Depositing a mask that will allow for etching of the alternating superjunctions layers. This mask can be photoresist, dielectric, metal or another semiconductor.
8) Etching the superjunction layers. Etching can be performed using dry etching (e.g., plasma based etching) or wet etching (e.g., liquids, specifically acids).
9) Depositing another mask for subsequent regrowth of p+ and n+ contact regions. In some aspects, removal of the mask of step 7 is not necessary.
10) Regrowing p+ or n+ contact regions at exposed ends of the p-type and n-type layers using any deposition technique highlighted in step 5.

11) Depositing n-type or p-type ohmic contacts. Many different kinds of surface treatments can be applied to the semiconductor surface before the metal is deposited. For example, surface treatments using acids (e.g., HCl, HF, $HNO_3$), bases (e.g., NaOH, KOH), or plasmas (fluorine, chlorine, oxygen based) may be utilized. Furthermore, the metal(s) deposited may be exposed to thermal anneal after deposition.

BRIEF DESCRIPTION OF THE DRAWINGS

The disclosure is best understood from the following detailed description when read with the accompanying figures. It is emphasized that, in accordance with standard practice in the industry, various features are not drawn to scale. In fact, the dimensions of various features may be arbitrarily increased or reduced for clarity of discussion.

DETAILED DESCRIPTION

Figure 1:
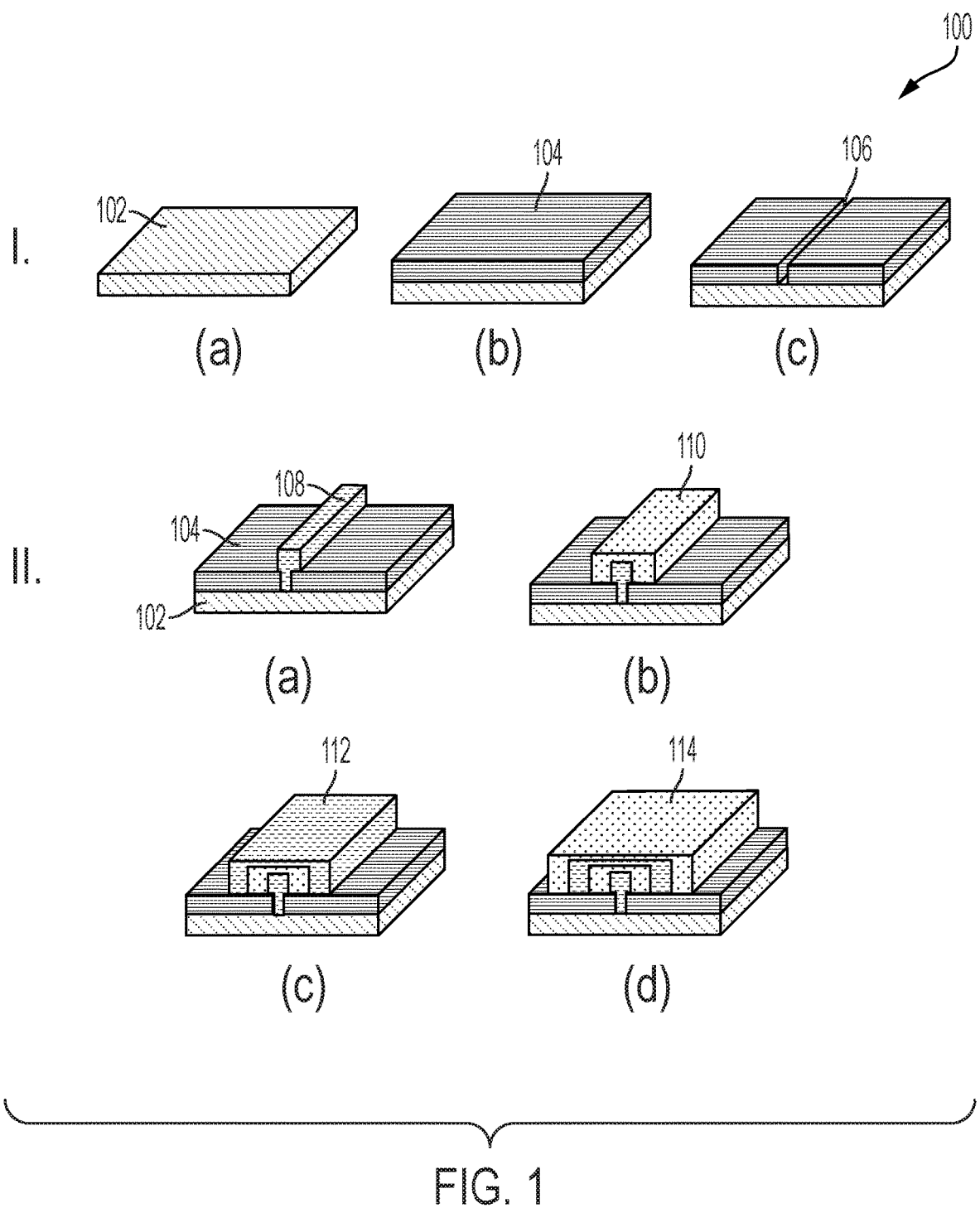
FIGS. 1-3 illustrate methods of making a superjunction according to various aspects of the disclosure.
Figure 1:
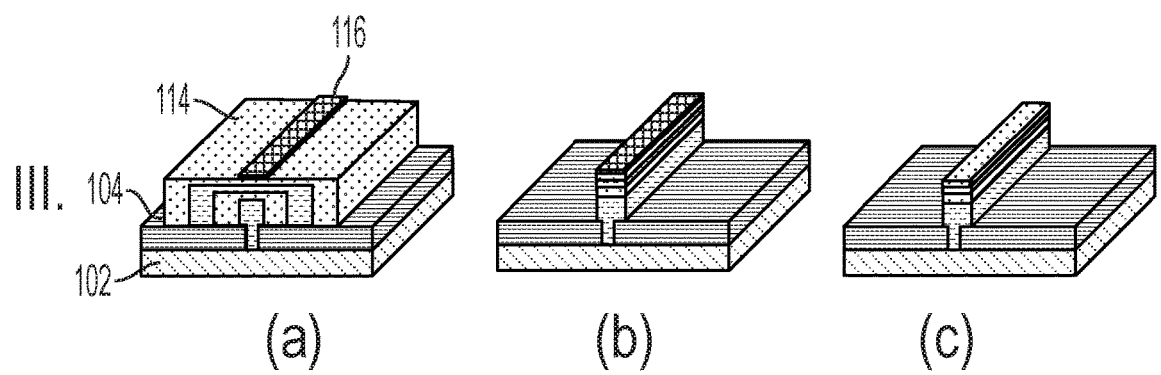
Figure 1:
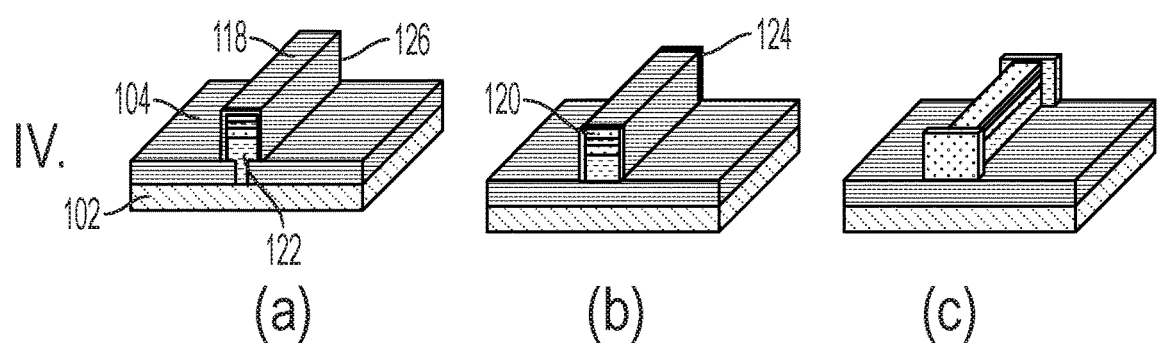
Figure 1:
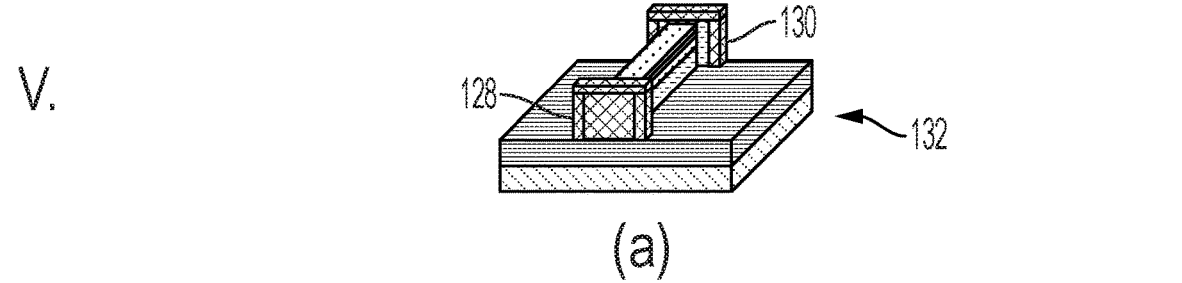

Embodiment(s) of the disclosure will now be described more fully with reference to the accompanying Drawings. The disclosure may, however, be embodied in many different forms and should not be construed as limited to the embodiment(s) set forth herein. The disclosure should only be considered limited by the claims as they now exist and the equivalents thereof.

Disclosed is a process for forming a lateral superjunction device on a silicon or sapphire substrate having doped GaN layers with favorable defect density (i.e., close to zero) due to use of a selective epitaxy technique. The lateral superjunction of the present disclosure is directed to the problem of manufacturing low-defect power electronics with high breakdown voltages and low on-resistance from GaN deposited on inexpensive (silicon or sapphire) substrates. Use of the described process decreases defects with a concomitant enhancement of device performance. In particular, devices manufactured with the disclosed process exhibit higher break-down voltages and lower on-resistances.

The lateral superjunction disclosed herein can be used to manufacture superior electronic devices that can be combined in an electronic circuit to improve efficiency in low and high power applications. Furthermore, the procedure described herein can reduce manufacturing costs and increase yields of current technologies. Power electronic applications require a lateral or vertical electronic device to be able to conduct electricity with minimal resistance during the on-state and be able to block high voltages during the off-state. However, material and device trade-offs exist such that it is difficult to achieve both of these attributes in a power electronic device. Material defects have proven to be detrimental to device operation and yield. The disclosure improves material quality by reducing defects through trapping in a small opening during the growth. This technique is known as selective area epitaxy (also sometimes referred to as nano-heteroepitaxy or aspect ratio trapping) in the semiconductor industry. Device design is improved by adopting standard silicon technology known as a superjunction. Alternating layers of n-type and p-type semiconductor material is a characteristic of the superjunction and produces an electronic device that is able to conduct electricity well in the on-state and block high voltages in the off-state. The utilization of selective epitaxy and a lateral superjunction produce a device with superior electrical performance, while also increasing yield and reliability in the manufacturing process.

The disclosure allows for current device performance to be greatly exceeded. The semiconductor industry continues to strive for integration and miniaturization. This disclosure allows for both integration and miniaturization of power electronics by describing a process that is transferable to any substrate and can be integrated on chip with silicon control electronics, significantly reducing the footprint and parasitics of an electronics circuit board has in a given product.

Synthesis of separate semiconductor processing techniques and device design take advantage of breakthroughs in semiconductor fabrication. Gallium-nitride (GaN) based electronics have struggled to perform as well as theoretically predicted. GaN-based electronics that perform close to theoretical limits have recently been manufactured. It was found that a reduction in defect density and the utilization of doped GaN lead to improved device operation. However, the fabrication process used is vertical in nature and requires expensive substrates that are difficult to manufacture and scale to larger diameters for cost reduction. In contrast, the disclosure described herein uses lateral devices that exhibit similar defect densities and alternating layers of doped GaN to produce devices termed superjunctions.

Superjunctions are a well-developed technology for silicon-based electronics, but are not manufactured using GaN due to difficulties related to manufacturing p-type GaN and making proper electronic contact to the material. These difficulties are overcome with the lateral nature of the fabrication process disclosed herein that allows for trivial scaling procedures and for inexpensive substrates to be used (i.e., silicon and sapphire). Other substrates, such as silicon carbide and bulk GaN substrates cost 5× to 50× more than the silicon and sapphire substrates. While vertical superjunction device technology based on silicon has been in the industry for decades and has proven to be extremely successful, lateral superjunctions made from silicon have not performed as well as the vertical devices due to substrate depletion effects and poor dopant distribution control from ion implantation. The novel process outlined herein does not suffer from substrate depletion because of the selective epitaxy technique. The novel process outlined herein reduces substrate depletion effects while eliminating damage and dopant distribution issues associated with ion implantation.

In some aspects, magnesium is used as a dopant for the GaN. Magnesium diffuses significantly at temperatures used for growth. Techniques to minimize the diffusion are crucial to ensure proper device operation. For example, films with high defect densities will have strong dopant diffusion. However, if defects are properly reduced then dopant diffusion is also significantly reduced. Furthermore, highly doped GaN must be regrown or created by ion implantation to allow for a proper metal/semiconductor contact to be formed. Development of the regrown GaN and its impact on Mg diffusion is another critical piece of knowledge to be obtained. Bulk GaN substrates have low defect densities ($<10^5$ cm$^{-2}$), which is desirable. However, bulk GaN has a slow growth rate for substrate formation, is expensive (e.g., two inch wafers are extremely expensive), and scaling of bulk GaN substrates to reduce cost has proven difficult. In contrast, forming selective GaN on silicon substrates is relatively inexpensive and scales well, while at the same time provides similarly low defect densities ($<10^6$ cm$^{-2}$).

deposited directly on the silicon, graded AlxGa1-xN buffer layers are deposited on top of the AlN, and finally a GaN layer is deposited on top of the graded AlxGa1-xN. This is done to manage thermal and lattice mismatch between the substrate and the GaN layer. In some aspects, the final starting material before selective epitaxy is comprised of the following layers: bulk silicon substrate/AlN/AlxGa1-xN/GaN.

In step I(c), a patterning technique is used to form an opening 106 in layer 104. Patterning techniques suitable for forming opening 106 include optical lithography, nanoimprint lithography, electron beam lithography, etc. As illustrated in step I(c), opening 106 is in the form of a trench or groove that exposes a portion of substrate 102.

In stage II, layers of n-type and p-type semiconductors are deposited onto the product of stage I. In step II(a), a layer 108 is deposited in opening 106. Layer 108 may be an n-type or a p-type semiconductor. For the purposes of illustration of method 100, layer 108 is chosen to be a p-type semiconductor. In step II(b), a layer 110 is deposited on top of layer 108. Layer 110 is an n-type semiconductor. In step II(c), a layer 112 is deposited on top of layer 110. Layer 112 is a p-type semiconductor. In step II(d), a layer 114 is deposited on top of layer 112. Layer 114 is an n-type semiconductor.

TABLE 1

GaN Superjunction compared to other configurations

| Technology Comparison | Silicon | GaN/Si | 4H—SiC | GaN/GaN | GaN SJ |
|---|---|---|---|---|---|
| Normalized Wafer + epi cost ($-mm$^{-2}$) | 1 | 1.7 | 6 | 60 | 2.1 |
| Defects (cm$^{-2}$) | <1 | $10^9$ | $10^3$ –> $10^4$ | $10^4$ –> $10^6$ | <$10^6$ |
| Wafer diameter (mm) | 300 | 150 | 150 | 50 | 200 |
| Avalanche Breakdown | Yes | No | Yes | Yes | Yes |
| Current Collapse/Dynamic $R_{ON}$ | No | Yes | No | No | No |

Referring now to FIG. 1, a method 100 of making a superjunction 132 is illustrated according to various aspects of the disclosure. For illustrative purposes, method 100 is shown in five stages I-V. Stage I includes steps (a)-(c), stage II includes steps (a)-(d), and so on.

In stage I, a substrate 102 is selected and prepared for deposition of superjunction layers. In step I(a), a substrate 102 is selected. Various substrates may be used including silicon and sapphire. In step I(b), a layer 104 is deposited on substrate 102. Layer 104 is a nucleation layer of amorphous or dielectric material and acts as a mask during selective epitaxy. Layer 104 is chosen to be a material that does not facilitate growth of material for the superjunction. In some aspects, layer 104 is GaN. In other aspects, layer 104 could be one or more of AlN, InN, GaN, SiN, or SiO$_2$. Thickness and composition of layer 104 are highly dependent on the diameter of substrate 102. Layer 104 can be deposited on the substrate using various techniques. For example, layer 104 can be deposited using PVD or CVD techniques. In some aspects, metals such as tungsten can be used as a selective epitaxy mask. While these metals are more poly crystalline than amorphous, the metals can still be effective.

In some aspects, step I(b) may be omitted if the substrate obtained in step I(a) works as a good nucleation site for the selective epitaxy in the following steps (e.g. bulk GaN substrates). In some aspects, on silicon substrates, AlN is In some aspects, layer 108 is an n-type semiconductor, and layers 110, 112, and 114 are chosen so that layers of p-type and n-type semiconductor alternate. The number of layers, thickness of each layer, and doping density of each layer depends on the application. In some aspects, layer thickness can be between 10 nanometers and 10 microns. In some aspects, doping density can be between $10^{15}$ cm$^{-3}$ and $10^{20}$ cm$^{-3}$.

Layers 108-114 can be deposited using various deposition techniques, including metal-organic chemical vapor deposition (MOCVD), molecular beam epitaxy (MBE), hydride vapor phase epitaxy (HYPE), evaporation deposition, sputter deposition, liquid-phase epitaxy (LPE), and various other PVD or CVD techniques. Though GaN-based superjunctions are discussed in this illustrative example, materials other than GaN can be used. For example, other acceptable materials include GaAs, SiC, InN, AlN, Ga$_2$O$_3$ and any other semiconductor that can be doped n-type and p-type.

In stage III, etching of the layers 108-114 is performed. In step III(a), a mask 116 is deposited on top of layer 114. In some aspects, mask 116 can be a layer of photoresist. In other aspects, other types of masks can be used including dielectrics, metals, or another semiconductor. In step III(b), an etching process is used to remove portions of layers 108-114 that are not beneath mask 116. Etching can be accomplished using various techniques, including dry etching (e.g., plasma based etching) or wet etching (e.g., using liquids such as acids or bases). The etching of step III(b) leaves a stack of alternating layers of n-type and p-type semiconductors. In step III(c), mask 116 is removed. In some aspects, mask 116 is not removed and is used in stage IV.

In stage IV, n-type and p-type contact regions are formed at end portions of layers 108-114. In step IV(a), a mask 118 is deposited to cover layers 108-114, but end portions 122 and 126 are left exposed. In some aspects, mask 116 is left in place and mask 118 is deposited over mask 116. In some aspects, mask 118 can be a layer of photoresist. In other aspects, other types of masks can be used including dielectrics, metals, or another semiconductor. In step IV(b), a first end layer 120 is added to end portion 122 of superjunction 132 and an second end layer 124 is added to end portion 126 of superjunction 132. First and second end layers 120 and 124 are selected so that one of layers 120 and 124 is an n-type semiconductor and the other of layers 120 and 124 is a p-type semiconductor. In some aspects, first end layer 120 is an n-type semiconductor that couples to layers 110 and 114 and second end layer 124 is a p-type semiconductor that couples to layers 108 and 112. In some aspects, first end layer 120 is a p-type semiconductor that couples to layers 108 and 112 and second end layer 124 is an n-type semiconductor that couples to layers 110 and 114. First and second end layers 120 and 124 can be deposited using various deposition techniques, including MOCVD, MBE, HYPE, evaporation deposition, sputter deposition, LPE, and various other PVD or CVD techniques. In step IV(c), mask 118 (and mask 116 if mask 116 was not previously removed) is removed.

In stage V, ohmic contacts 128 and 130 are formed. In step V(a), ohmic contacts 128 and 130 are deposited on layers 120 and 124. Ohmic contacts 128 and 130 can be formed of various metals, including Al, Ti, Ni, Au, Ta and combinations thereof. In some aspects, various surface treatments with acids, bases, plasmas and combinations thereof can be applied to a surface of layers 120 and 124 before the metal for the ohmic contacts 128 and 130 is deposited. In some aspects, the metal(s) deposited for the ohmic contacts 128 and 130 may be exposed to thermal anneal after deposition.

Figure 2:
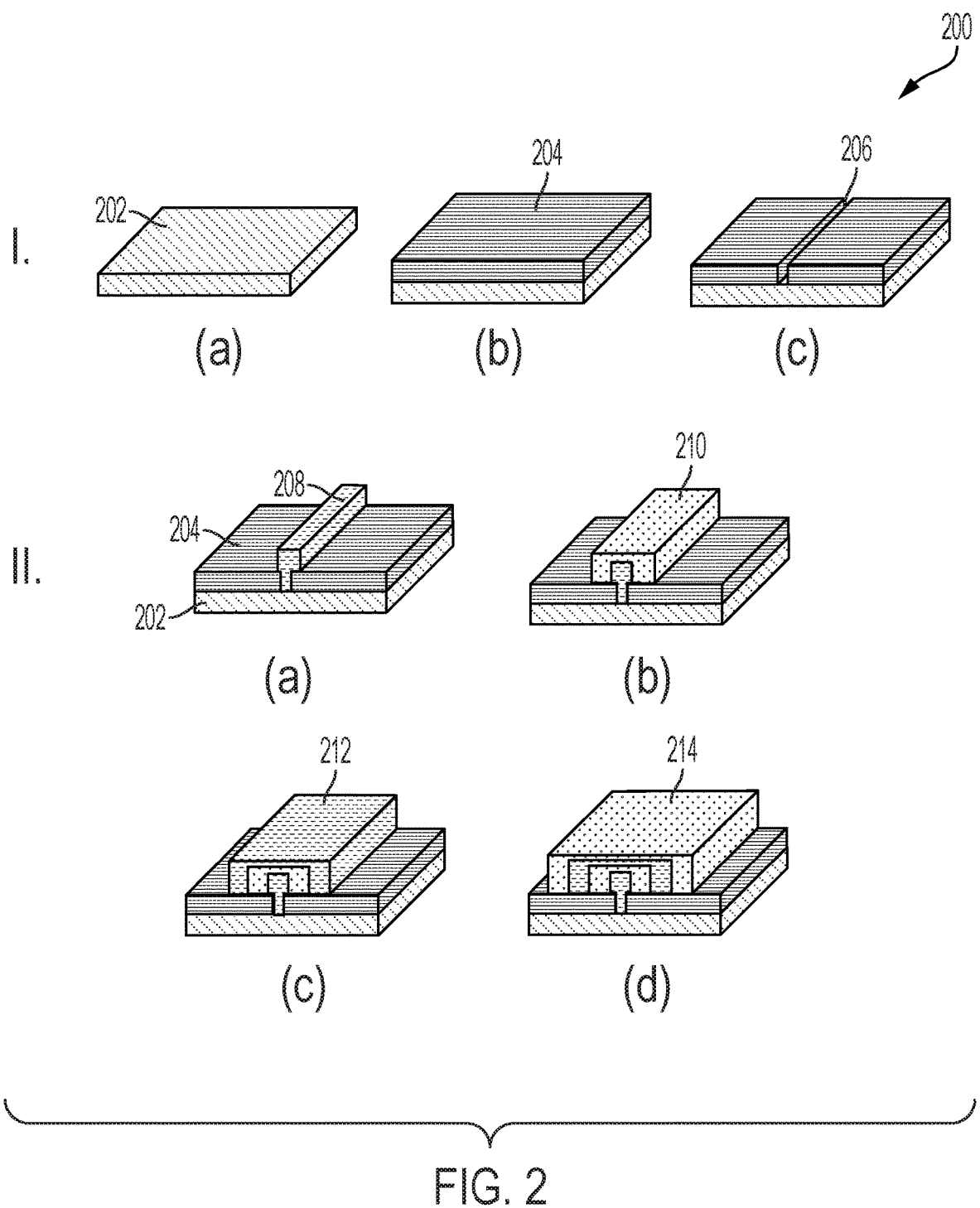
Figure 2:
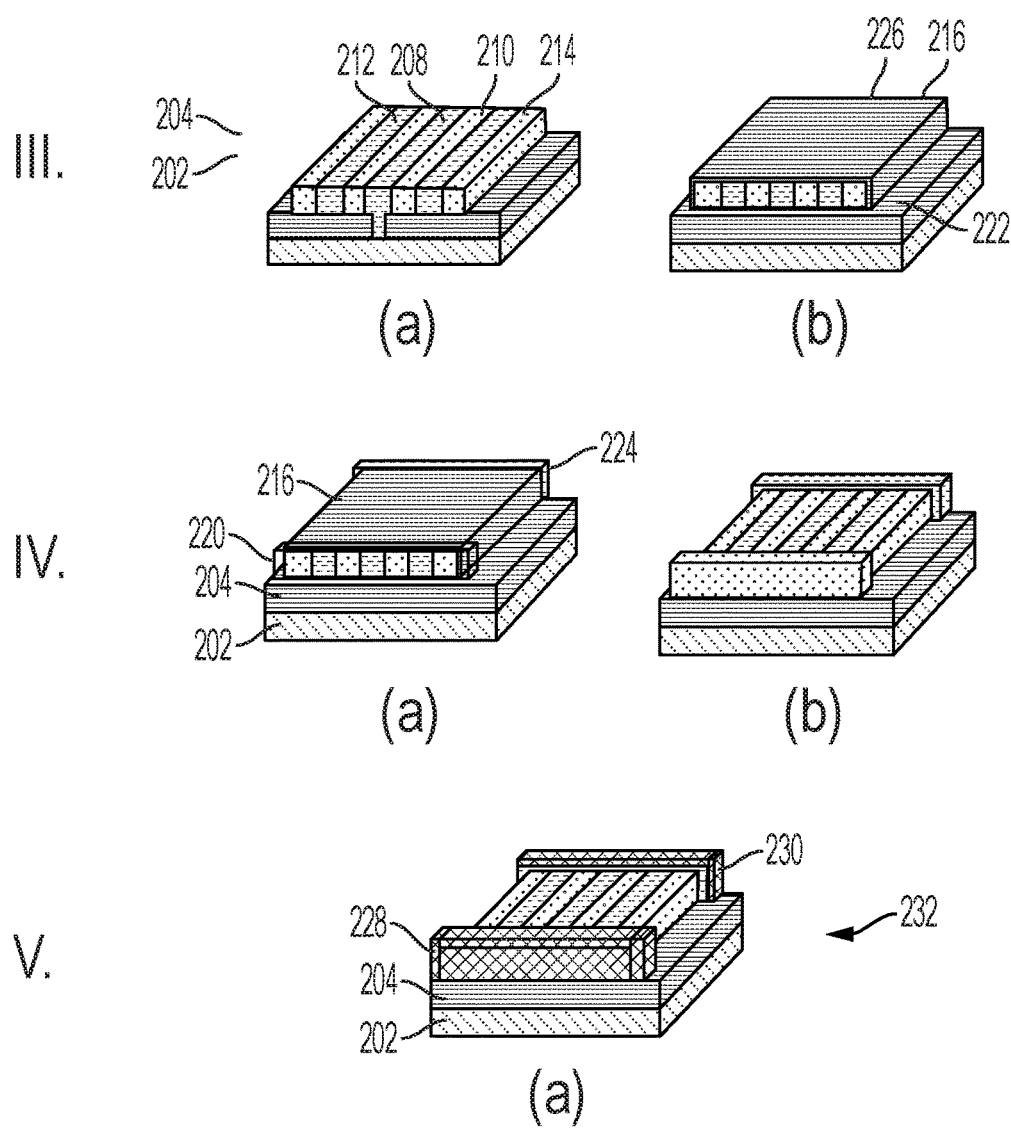

Referring now to FIG. 2, a method 200 of making a superjunction 232 is illustrated according to various aspects of the disclosure. For illustrative purposes, method 200 is shown in five stages I-V. Stage I includes steps (a)-(c), stage II includes steps (a)-(d), and so on.

In stage I, a substrate 202 is selected and prepared for deposition of superjunction layers. In step I(a), a substrate 202 is selected. Various substrates may be used including silicon and sapphire. In step I(b), a layer 204 is deposited on substrate 202. Layer 204 is a nucleation layer of amorphous or dielectric material and acts as a mask during selective epitaxy. In some aspects, layer 204 is GaN. In other aspects, layer 204 could be one or more of AlN, InN, and GaN. Thickness and composition of layer 204 are highly dependent on diameter of substrate. Layer 204 can be deposited on the substrate using various techniques. For example, layer 204 can be deposited using PVD or CVD. In some aspects, metals such as tungsten can be used a selective epitaxy mask. While these metals are more poly crystalline than amorphous, the metals can still be effective.

In some aspects, step I(b) may be omitted if the substrate obtained in step I(a) works as a good nucleation site for the selective epitaxy in the following steps (e.g., bulk GaN substrates). For example, on silicon substrates, AlN is deposited directly on the silicon, graded AlxGa1-xN buffer layers are deposited on top of the AlN, and finally a GaN layer is deposited on top of the graded AlxGa1-xN. This is done to manage thermal and lattice mismatch between the substrate and the GaN layer. In some aspects, the final starting material before selective epitaxy is comprised of the following layers: bulk silicon substrate/AlN/AlxGa1-xN/GaN.

In step I(c), a patterning technique is used to form an opening 206 in layer 204. Patterning techniques suitable for forming opening 206 include optical lithography, nanoimprint lithography, electron beam lithography, etc. As illustrated in step I(c), opening 206 is in the form of a trench or groove that exposes a portion of substrate 202.

In stage II, layers of n-type and p-type semiconductors are deposited onto the product of stage I. In step II(a), a layer 208 is deposited in opening 206. Layer 208 may be an n-type or a p-type semiconductor. For the purposes of illustration of method 200, layer 208 is chosen to be a p-type semiconductor. In step II(b), a layer 210 is deposited on top of layer 208. Layer 210 is an n-type semiconductor. In step II(c), a layer 212 is deposited on top of layer 210. Layer 212 is a p-type semiconductor. In step II(d), a layer 214 is deposited on top of layer 212. Layer 214 is an n-type semiconductor. In some aspects, layer 208 is an n-type semiconductor, and layers 210, 212, and 214 are chosen so that layers of p-type and n-type semiconductor alternate. The number of layers, thickness of each layer, and doping density of each layer depends on the application. In some aspects, layer thickness can be between 10 nanometers and 10 microns. In some aspects, doping density can be between $10^{15}$ cm$^{-3}$ and $10^{20}$ cm$^{-3}$.

Layers 208-214 can be deposited using various deposition techniques, including MOCVD, MBE, HYPE, evaporation deposition, sputter deposition, LPE, and various other PVD or CVD techniques. Though GaN-based superjunctions are discussed in this illustrative example, materials other than GaN can be used. For example, other acceptable materials include GaAs, SiC, InN, AlN, Ga$_2$O$_3$ and any other semiconductor that can be doped n-type and p-type.

In stage III, etching of the layers 208-214 is performed. In step III(a), an etching process is used to remove a upper portions of layers 208-214. As illustrated in step III(a), a sufficient amount of material is removed by the etching step so that an upper portion of each layer 200-214 is exposed. The etching of step III(a) leaves alternating layers of n-type and p-type semiconductors arranged in a side by side position (e.g., conformal deposition). Etching can be accomplished using various techniques, including dry etching (e.g., plasma based etching) or wet etching (e.g., using liquids such as acids). In step III(b), a mask 216 is deposited on top of layers 208-214. Mask 216 is positioned to leave end portions 222 and 226 exposed.

In stage IV, n-type and p-type contact regions are formed at end portions of layers 208-214. In step IV(a), a first end layer 220 is added to end portion 222 of superjunction 232 and a second end layer 224 is added to end portion 226 of superjunction 232. First and second end layers 220 and 224 are selected so that one of layers 220 and 224 is an n-type semiconductor and the other of layers 220 and 224 is a p-type semiconductor. In some aspects, first end layer 220 is an n-type semiconductor that couples to layers 210 and 214 and second end layer 224 is a p-type semiconductor that couples to layers 208 and 212. In some aspects, first end layer 220 is a p-type semiconductor that couples to layers 208 and 212 and second end layer 224 is an n-type semiconductor that couples to layers 210 and 214. First and second end layers 220 and 224 can be deposited using various deposition techniques, including MOCVD, MBE, HYPE, evaporation deposition, sputter deposition, LPE, and various other PVD or CVD techniques. In step IV(b), mask 216 is removed.

In stage V, ohmic contacts 228 and 230 are formed. In step V(a), ohmic contacts 228 and 230 are deposited on layers 220 and 224. Ohmic contacts 228 and 230 can be formed of various metals, including Al, Ti, Ni, Au, Ta and combinations thereof. In some aspects, various surface treatments with acids, bases, plasmas and combinations thereof can be applied to a surface of layers 220 and 224 before the metal for the ohmic contacts 228 and 230 is deposited. In some aspects, the metal(s) deposited for the ohmic contacts 228 and 230 may be exposed to thermal anneal after deposition.

Figure 3:
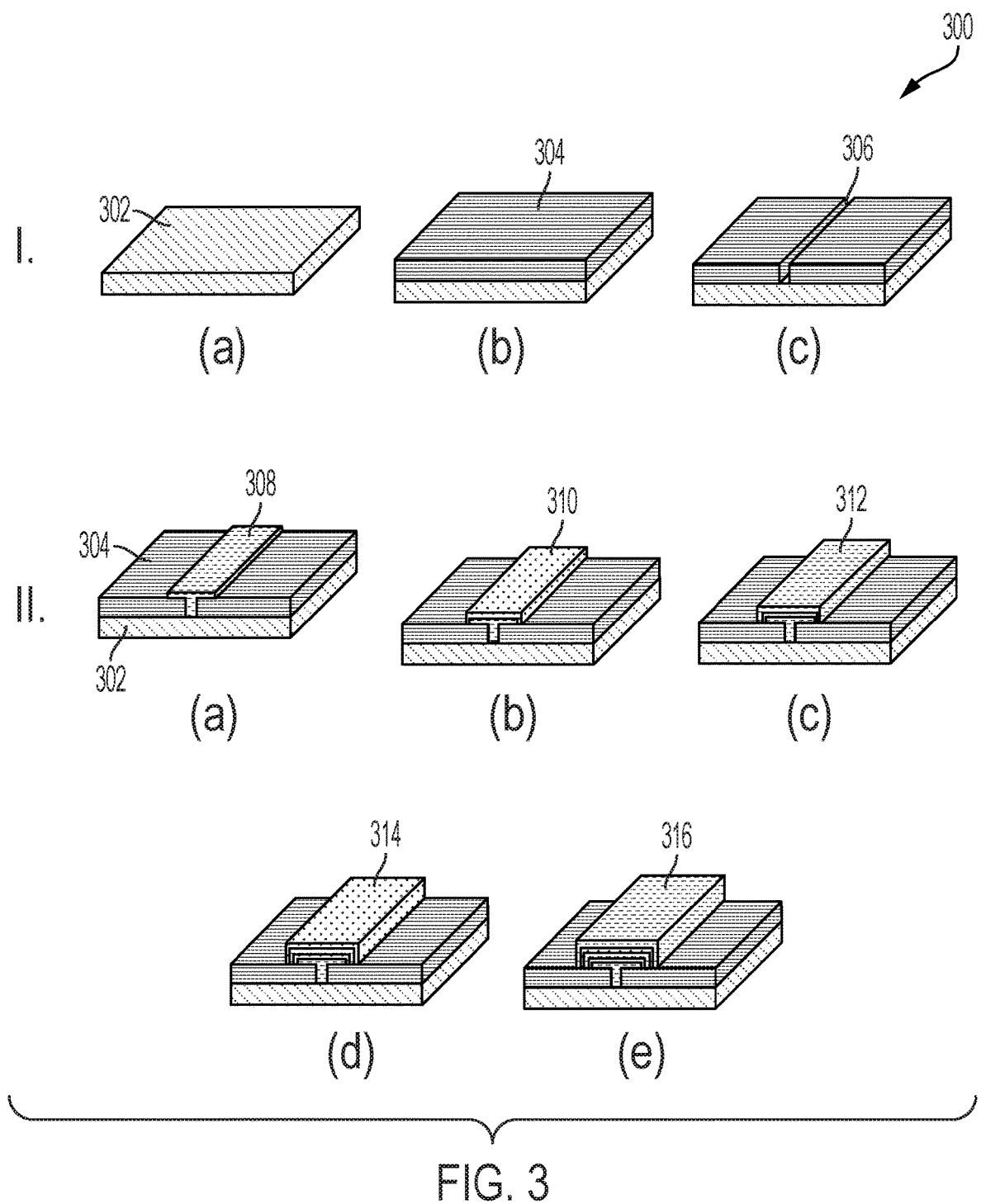
Figure 3:
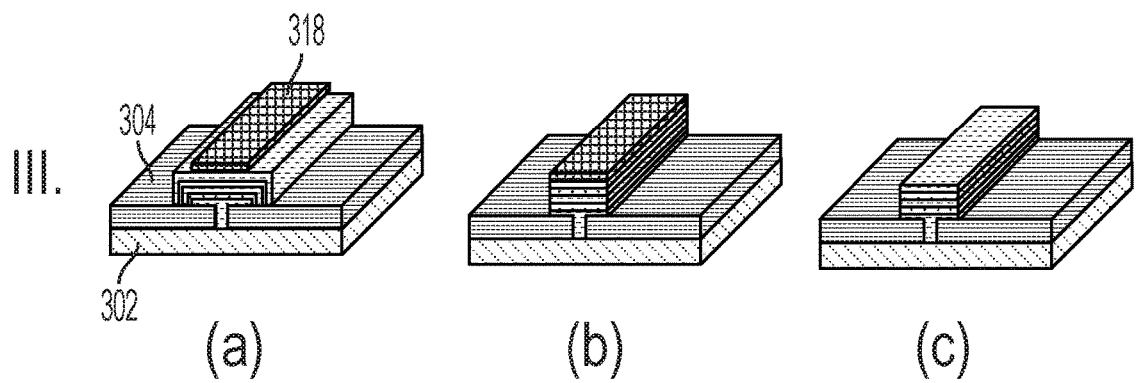
Figure 3:
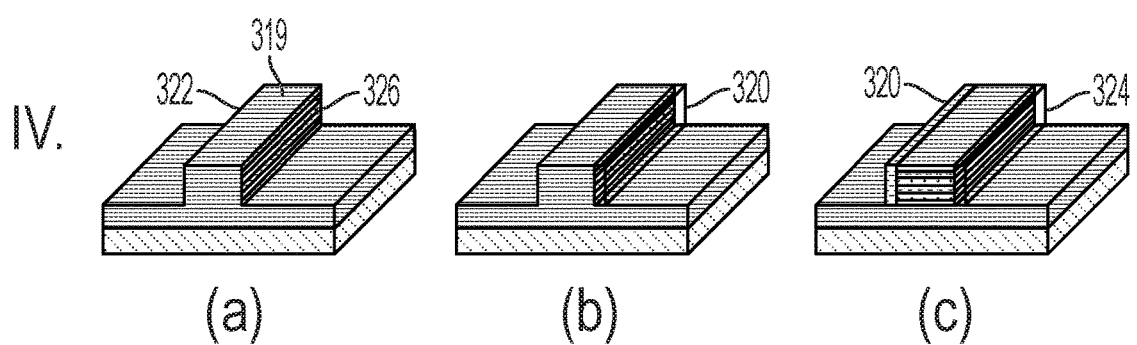
Figure 3:
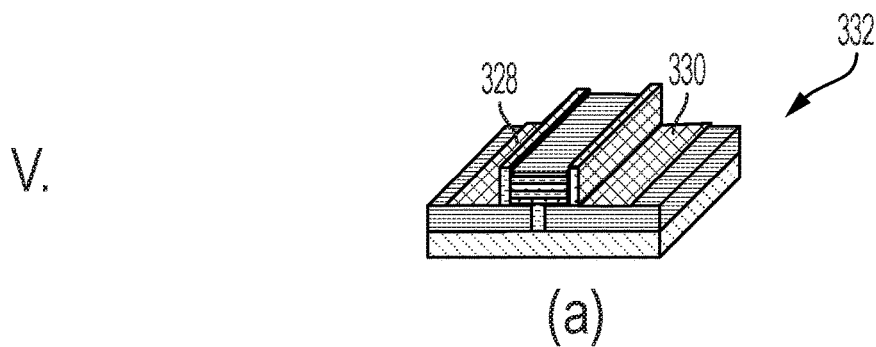

Referring now to FIG. 3, a method 300 of making a superjunction 332 is illustrated according to various aspects of the disclosure. For illustrative purposes, method 300 is shown in five stages I-V. Stage I includes steps (a)-(c), stage II includes steps (a)-(d), and so on.

In stage I, a substrate 302 is selected and prepared for deposition of superjunction layers. In step I(a), a substrate 302 is selected. Various substrates may be used including silicon and sapphire. In step I(b), a layer 304 is deposited on substrate 302. Layer 304 is a nucleation layer of amorphous or dielectric material and acts as a mask during selective epitaxy. In some aspects, layer 304 is GaN. In other aspects, layer 304 could be one or more of AlN, InN, and GaN. Thickness and composition of layer 304 are highly dependent on diameter of substrate. Layer 304 can be deposited on the substrate using various techniques. For example, layer 304 can be deposited using PVD or CVD. In some aspects, metals such as tungsten can be used a selective epitaxy mask. While these metals are more poly crystalline than amorphous, the metals can still be effective.

In some aspects, step I(b) may be omitted if the substrate obtained in step I(a) works as a good nucleation site for the selective epitaxy in the following steps (e.g. bulk GaN substrates). For example, on silicon substrates, AlN is deposited directly on the silicon, graded AlxGa1-xN buffer layers are deposited on top of the AlN, and finally a GaN layer is deposited on top of the graded AlxGa1-xN. This is done to manage thermal and lattice mismatch between the substrate and the GaN layer. In some aspects, the final starting material before selective epitaxy is comprised of the following layers: bulk silicon substrate/AlN/AlxGa1-xN/GaN.

In step I(c), a patterning technique is used to form an opening 306 in layer 304. Patterning techniques suitable for forming opening 306 include optical lithography, nanoimprint lithography, electron beam lithography, etc. As illustrated in step I(c), opening 306 is in the form of a trench or groove that exposes a portion of substrate 302.

In stage II, layers of n-type and p-type semiconductors are deposited onto the product of stage I. In step II(a), a layer 308 is deposited in opening 306. Layer 308 may be an n-type or a p-type semiconductor. For the purposes of illustration of method 300, layer 308 is chosen to be a p-type semiconductor. In step II(b), a layer 310 is deposited on top of layer 308. Layer 310 is an n-type semiconductor. In step II(c), a layer 312 is deposited on top of layer 310. Layer 312 is a p-type semiconductor. In step II(d), a layer 314 is deposited on top of layer 312. Layer 314 is an n-type semiconductor. In step II(d), a layer 316 is deposited on top of layer 314. Layer 316 is a p-type semiconductor. In some aspects, layer 308 is an n-type semiconductor, and layers 310, 312, 314, and 316 are chosen so that layers of p-type and n-type semiconductor alternate. The number of layers, thickness of each layer, and doping density of each layer depends on the application. In some aspects, layer thickness can be between 10 nanometers and 10 microns. In some aspects, doping density can be between $10^{15}$ cm$^{-3}$ and $10^{20}$ cm$^3$.

Layers 308-316 can be deposited using various deposition techniques, including MOCVD, MBE, HYPE, evaporation deposition, sputter deposition, LPE, and various other PVD or CVD techniques. Though GaN-based superjunctions are discussed in this illustrative example, materials other than GaN can be used. For example, other acceptable materials include GaAs, SiC, InN, AlN, Ga$_2$O$_3$ and any other semiconductor that can be doped n-type and p-type.

In stage III, etching of the layers 308-316 is performed. In step III(a), a mask 318 is deposited on top of layer 316. In some aspects, mask 318 can be a layer of photoresist. In other aspects, other types of masks can be used including dielectrics, metals, or another semiconductor. In step III(b), an etching process is used to remove portions of layers 308-316 that are not beneath mask 318. Etching can be accomplished using various techniques, including dry etching (e.g., plasma based etching) or wet etching (e.g., using liquids such as acids). The etching of step III(b) leaves a stack of alternating layers of n-type and p-type semiconductors. In step III(c), mask 318 is removed. In some aspects, mask 318 is not removed and is used in stage IV.

In stage IV, n-type and p-type contact regions are formed at end portions of layers 308-316. In step IV(a), a mask 319 is deposited to cover layers 308-316 while leaving side portions 322 and 326 exposed. In some aspects, mask 318 is left in place and mask 319 is deposited over mask 318. In some aspects, mask 319 can be a layer of photoresist. In other aspects, other types of masks can be used including dielectrics, metals, or another semiconductor.

In step IV(b), a first end layer 320 is added to side portion 322 of superjunction 332 and in step IV(c) a second end layer 324 is added to side portion 326 of superjunction 332. As illustrated in FIG. 3, first and second end layers 320 and 324 are generally parallel to a length of trench 306. In FIGS. 1 and 2, end layers 120, 124, 220, and 224 are generally perpendicular to a length of trenches 106 and 206, respectively. First and second layers 320 and 324 are selected so that one of layers 320 and 324 is an n-type semiconductor and the other of layers 320 and 324 is a p-type semiconductor. In some aspects, first end layer 320 is an n-type semiconductor that couples to layers 310 and 314 and second end layer 324 is a p-type semiconductor that couples to layers 308, 312, and 316. In some aspects, first end layer 320 is a p-type semiconductor that couples to layers 308, 312, and 316 and second end layer 324 is an n-type semiconductor that couples to layers 310 and 314. First and second end layers 320 and 324 can be deposited using various deposition techniques, including MOCVD, MBE, HYPE, evaporation deposition, sputter deposition, LPE, and various other PVD or CVD techniques. In step IV(c), mask 319 (and mask 318 if mask 318 was not previously removed) is removed.

In stage V, ohmic contacts 328 and 330 are formed. In step V(a), ohmic contacts 328 and 330 are deposited on layers 320 and 324. Ohmic contacts 328 and 330 can be formed of various metals, including Al, Ti, Ni, Au, Ta and combinations thereof. In some aspects, various surface treatments with acids, bases, plasmas and combinations thereof can be applied to a surface of layers 320 and 324 before the metal for the ohmic contacts 328 and 330 is deposited. In some aspects, the metal(s) deposited for the ohmic contacts 328 and 330 may be exposed to thermal anneal after deposition.

In exemplary embodiments, an apparatus is disclosed that may include a substrate and a lateral superjunction device extending from the substrate. The lateral superjunction device may include means for providing alternating layers n-type and p-type semiconductors. The means for providing alternating layers of n-type and p-type semiconductors may include alternating layers of semiconductors that are stacked on top of one another (e.g., see layers 110-114 of FIG. 1 and layers 308-316 of FIG. 3) or alternating layers of semiconductor that are arranged next to one another (e.g., see layers 208-214 of FIG. 2). The number of layers of n-type and p-type semiconductors can vary based upon a particular application. The lateral superjunction device may include means for providing electrical contacts to the alternating layers of n-type and p-type semiconductors. The means for providing electrical contacts can include ohmic contacts surrounding a layer of semiconductor (e.g., see layers 120, 124 and 128, 130 of FIG. 1; see layers 220, 224 and 228, 230 of FIG. 2; and see layers 320, 324 and 328, 330 of FIG. 3). In some embodiments, the electrical contacts are positioned at opposite ends of alternating layers of semiconductor that are stacked on top of one another (e.g., see FIGS. 1 and 3). In some embodiments, the electrical contacts are positioned at opposite ends of alternating layers of semiconductor that are arranged next to one another (e.g., see FIG. 2).

Figure 4:
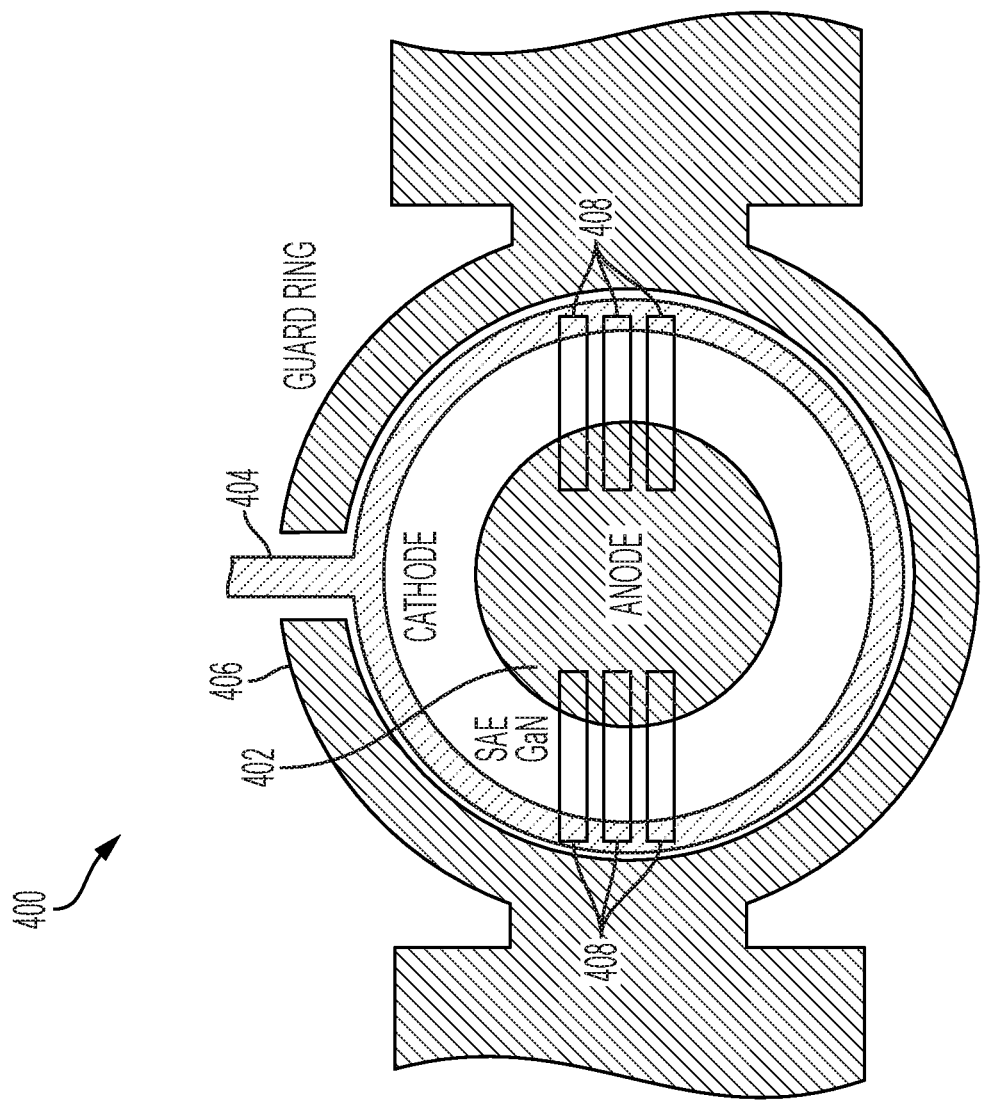
FIGS. 4 and 5 illustrate superjunction mask designs according various aspects of the disclosure.

Referring now to FIG. 4, a superjunction mask 400 is illustrated according to aspects of the disclosure. Superjunction mask 400 includes an anode 402, a cathode 404, and a guard ring 406. A plurality of superjunctions 408 connect anode 402 to cathode 404. Superjunctions 408 can be implemented as superjunctions 132 or 232 discussed above. Superjunctions 132 and 232 are suited to the design of superjunction mask 400 because superjunctions 132 and 232 include ohmic contacts positioned at their ends.

Figure 5:
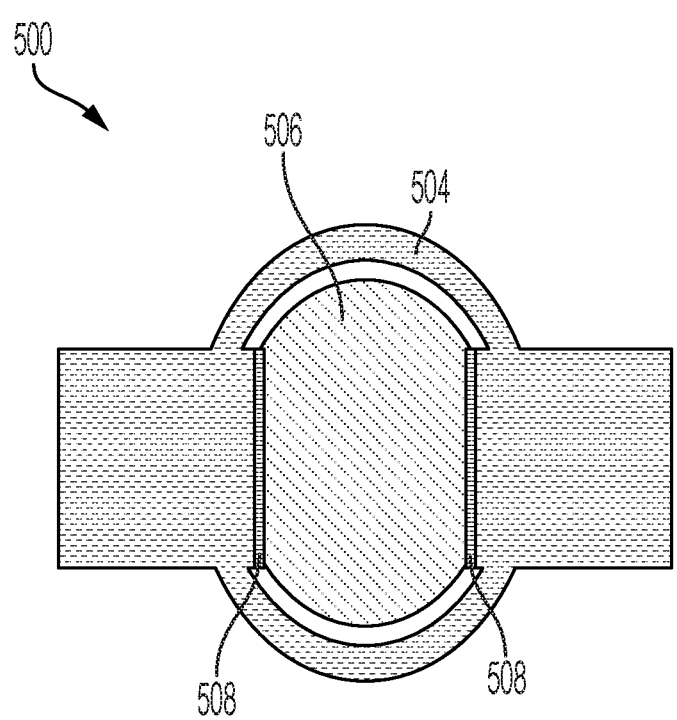

Referring now to FIG. 5, a superjunction mask 500 is illustrated according to aspects of the disclosure. Superjunction mask 500 includes an anode 502 and a cathode 504 that are connected via a plurality of superjunctions 508. Superjunctions 508 can be implemented as superjunction 332. Superjunction 332 is suited to the design of superjunction mask 400 which includes ohmic contacts 328 and 330 that are disposed along the sides of superjunction 332.

Figure 6:
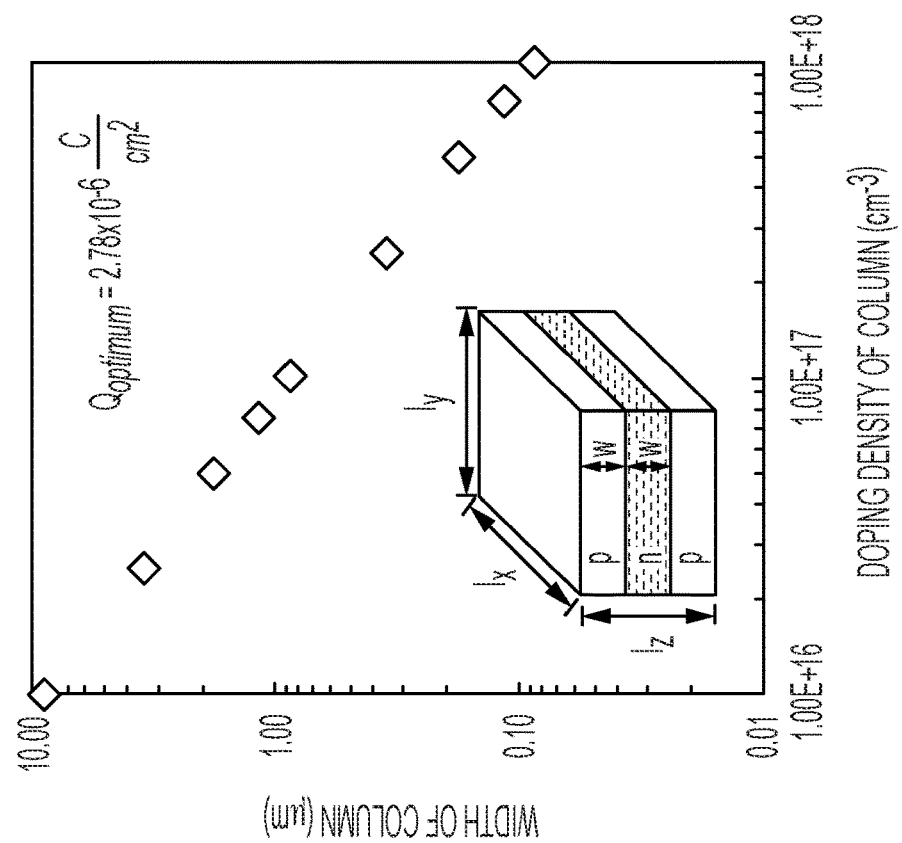
FIG. 6 is a graph of column width versus column doping density.

Referring now to FIG. 6, a graph illustrating column width versus column doping density according to aspects of the disclosure is shown. Equation 1 below describes optimum charge:

$$Q_{optimum} = 2.78 \times 10^{-6} \frac{C}{cm^2} \qquad \text{Equation 1}$$

FIG. 6 illustrates that doping density can be higher for narrower column widths, but must be decreased as column thickness increases. As shown in FIG. 6, doping densities for the optimum charge vary from 1.00E+16 on the low end to 1.00E+18 on the high end. This range stems from material characteristics of GaN n-type and p-type semiconductors. GaN N-type semiconductors can be manufactured with doping densities down to 1.00E+16, while GaN p-type semiconductors can be manufactured with doping densities up to 1.00E+18.

Figure 7:
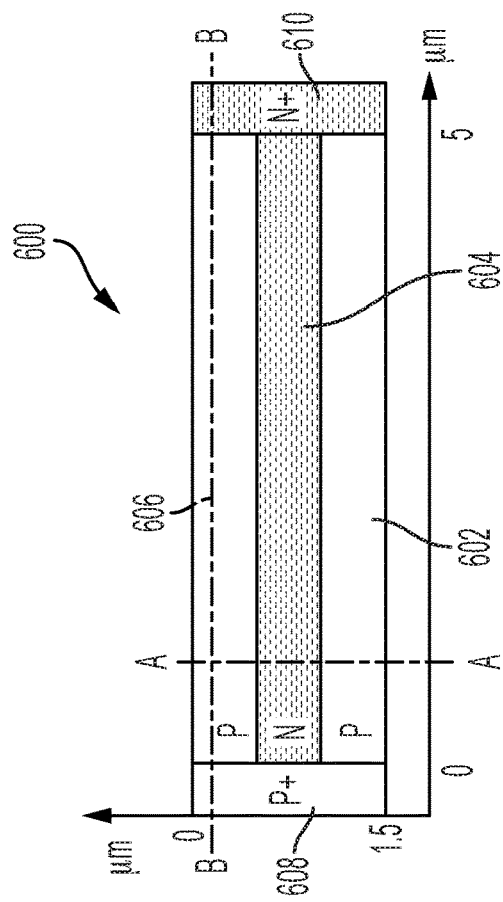
FIG. 7 is a schematic view of an illustrative superjunction.

Referring now to FIG. 7, a schematic illustration of a p+ and n+ layers for an illustrative superjunction 600 is shown. Superjunction 600 includes a base layer 602, a middle layer 604, and a top layer 606. In the embodiment shown in FIG. 7, base layer 602 is a p-type semiconductor, middle layer 604 is an n-type semiconductor, and top layer 606 is a p-type semiconductor. Superjunction 600 includes end portions 608 and 610 comprised of p+-type semiconductor and n+-type semiconductor. The designations of p+ and n+ are used to indicate higher doping densities compared to the doping densities of layers 602-606. In some aspects, doping densities that are ten times higher than the doping densities of layers 602-606 are used for end portions 608 and 610. The higher doping density helps facilitate conduction of electricity between metallic contacts and end portions 608 and 610 to get electricity into and out of superjunction 600, which reduces resistance and improves performance of superjunction 600.

In the embodiment illustrated in FIG. 7, each of layers 602-606 has a thickness of around 0.5 µm and a length of around 5.0 µm. End portions 608 and 610 have a height of around 1.5 µm, which corresponds to a height of the stack of layers 602-606. In other embodiments, each of layers 602-606 can have a thickness that ranges between 10 nanometers and 10 microns. A length each of layers 602-606 is determined based upon the particular application. In general, dimensions of layers 602-606 and end portions 608 and 610 depends on the particular application.

As shown in FIG. 7, end portion 608 is a p-type semiconductor that couples to layers 602 and 606 and end portion 610 is an n-type semiconductor that couples to layer 604. In other embodiments, base layer 602 may be an n-type semiconductor, middle layer 604 may be a p-type semiconductor, and top layer 606 may be an n-type semiconductor. In other embodiments, end portion 608 is an n-type semiconductor that couples to layer 604 and end portion 610 is a p-type semiconductor that couples to layers 602 and 606.

Figure 8:
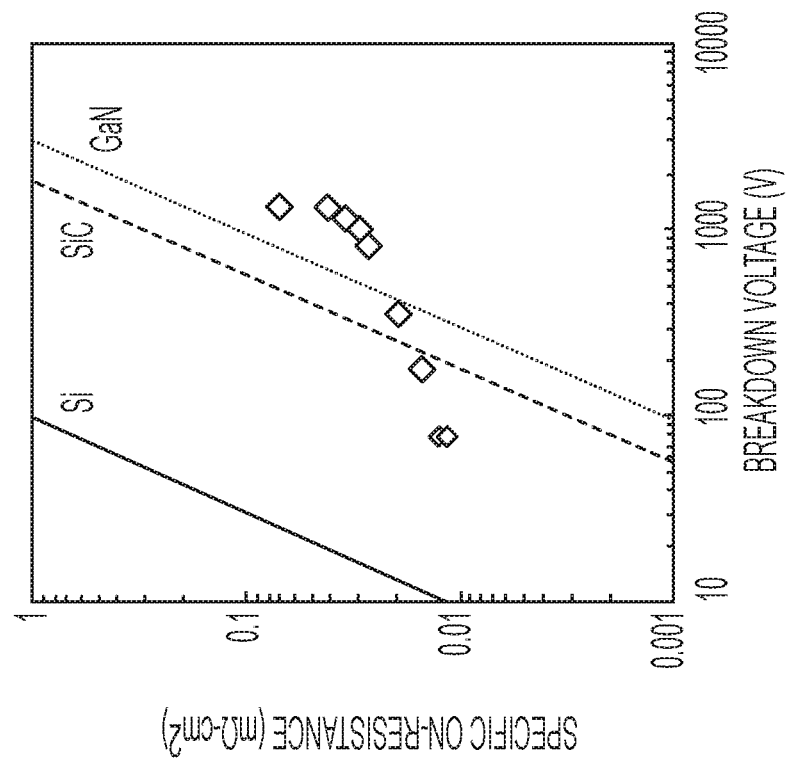
FIG. 8 is a graph of specific on-resistance versus breakdown voltage for the illustrative superjunction of FIG. 7.

Referring now to FIGS. 8-12 are graphs illustrating various performance aspects of illustrative superjunction 600 of FIG. 7 at a doping density of 5E+16 with layers 602-606 each having a thickness of 500 nm. FIG. 8 is a graph of specific on-state resistance versus breakdown voltage for superjunction 600 is shown. FIG. 8 illustrates that an increase in breakdown voltage (V) is accompanied by an increase in specific on-resistance (mΩ-cm$^2$). Lines for Si, SiC, and GaN illustrate theoretical values based upon material properties for Si, SiC, and GaN. As illustrated in FIG. 8, superjunction 600 is able to outperform the material properties of GaN for breakdown voltages of between approximately 400V to 1,100V.

Figure 9:
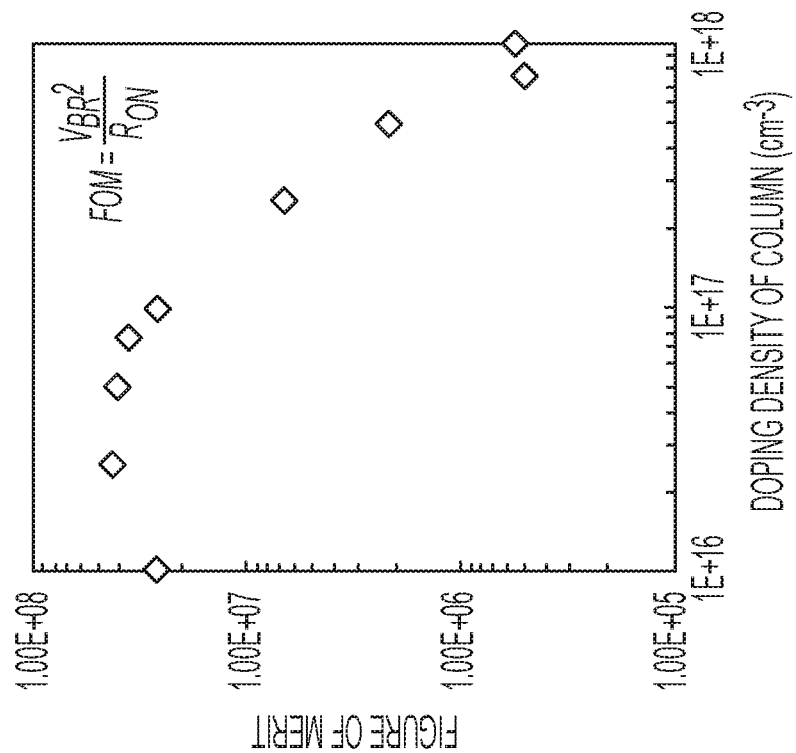
FIG. 9 is a graph of figure of merit versus column doping density for the illustrative super junction of FIG. 7.

Referring now to FIG. 9, a graph of figure of merit versus column doping density is shown. Equation 2 below describes figure of merit as the square of breakdown voltage divided by specific on-resistance.

$$FOM = \frac{V_{BR}^2}{R_{ON}} \qquad \text{Equation 2}$$

FIG. 9 illustrates that FOM peaks at a doping density of around 2E+16 to 3E+16. In some aspects, a doping density of 3E+16 may be desirable as the cost to manufacture a superjunction with a doping density of 3E+16 instead of 2E+16 should be lower. Furthermore, FIG. 9 illustrates a small difference between FOM values at doping densities of 3E+16 versus 2E+16. Similarly, in other aspects, using doping densities of 4E+16 or 5E+16 may be desirable to further lower costs while at the same time maintaining higher FOM values versus doping densities of 6E+16 or higher.

Figure 10B:
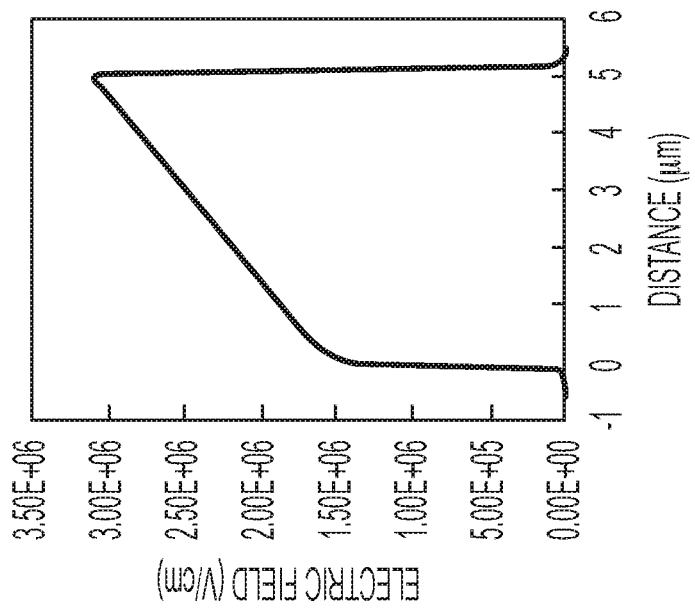
FIGS. 10A and 10B are graphs of electric field versus transverse and perpendicular distances for the illustrative super junction of FIG. 7.
Figure 10A:
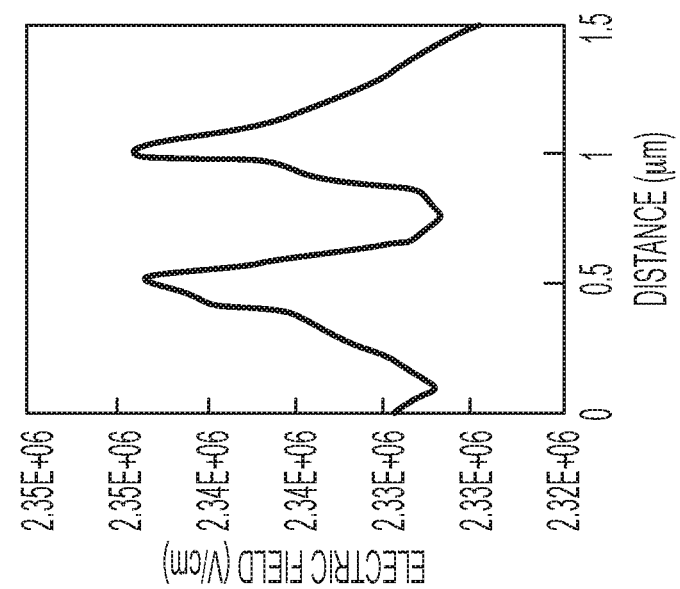

Referring now to FIGS. 10A and 10B, graphs of electric field versus transverse and perpendicular distances for the illustrative superjunction 600 of FIG. 7 are shown. FIGS. 10A and 10B were generated using a doping density value of 5E+16. FIG. 10A illustrates electric field distribution along a y-axis of superjunction 600 (e.g., see line A-A in FIG. 7). Peaks at 0.5 μm and 1 μm correspond with boundaries between layers 602-606. FIG. 10B illustrates electric field distribution along an x-axis of superjunction 600 (e.g., see line B-B in FIG. 7).

Figure 11:
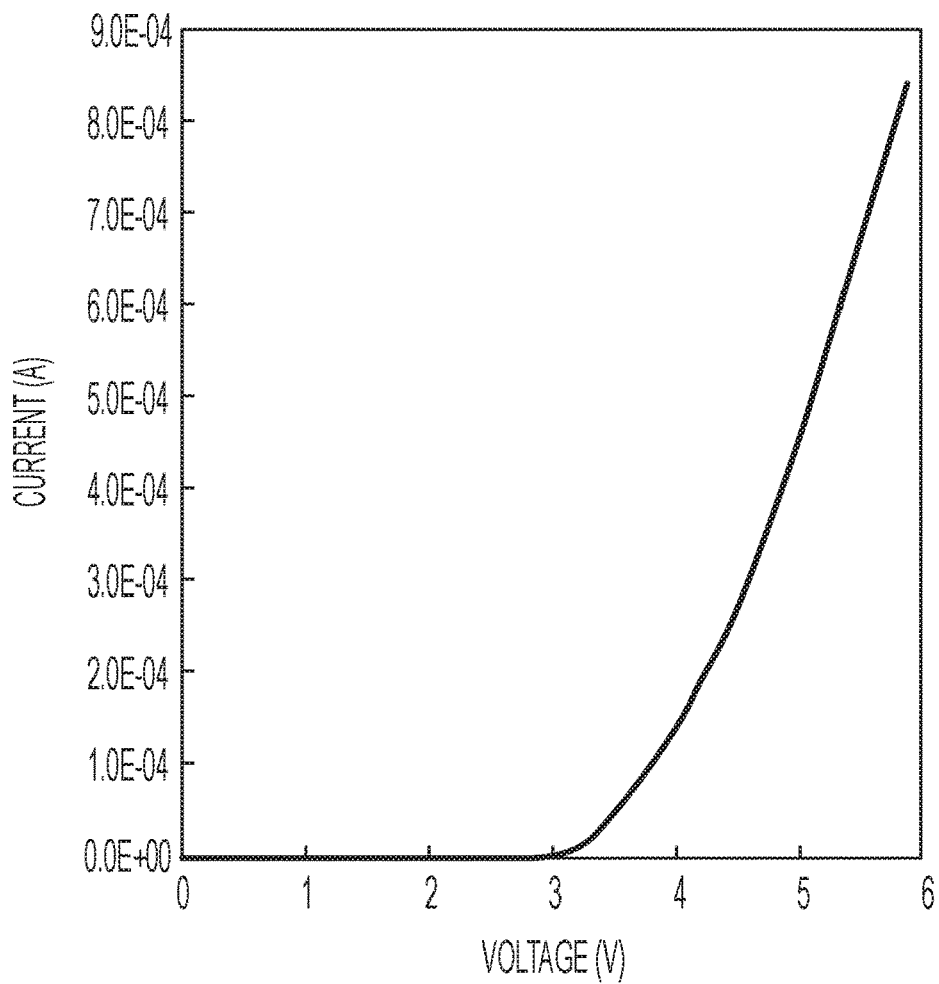
FIG. 11 is a graph of current versus voltage for the illustrative super junction of FIG. 7.
Figure 12:
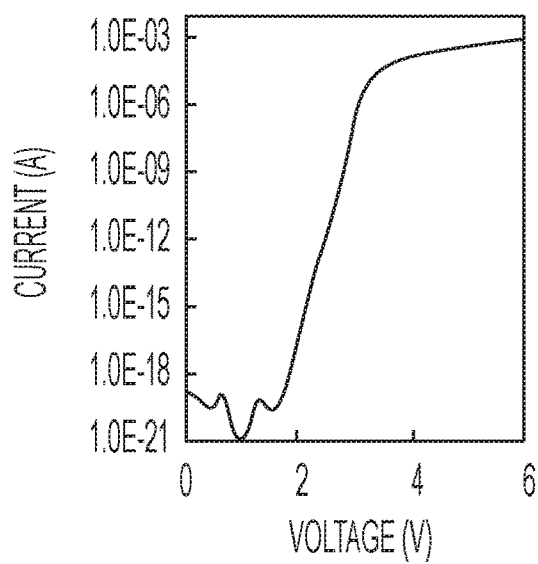
FIG. 12 is a graph of the log of the current of FIG. 11 versus voltage for the illustrative super junction of FIG. 7.

Referring now to FIG. 11, a graph of current versus voltage for illustrative superjunction 600 is shown. On-state resistance of superjunction 600 can be calculated by taking the slope of the curve beyond the turn-on voltage (e.g., above around 3V). FIG. 12, is a graph of the log of the current of FIG. 11. FIG. 12 shows the magnitude of change in the current for the off state and the on state of superjunction 600.

Figure 13:
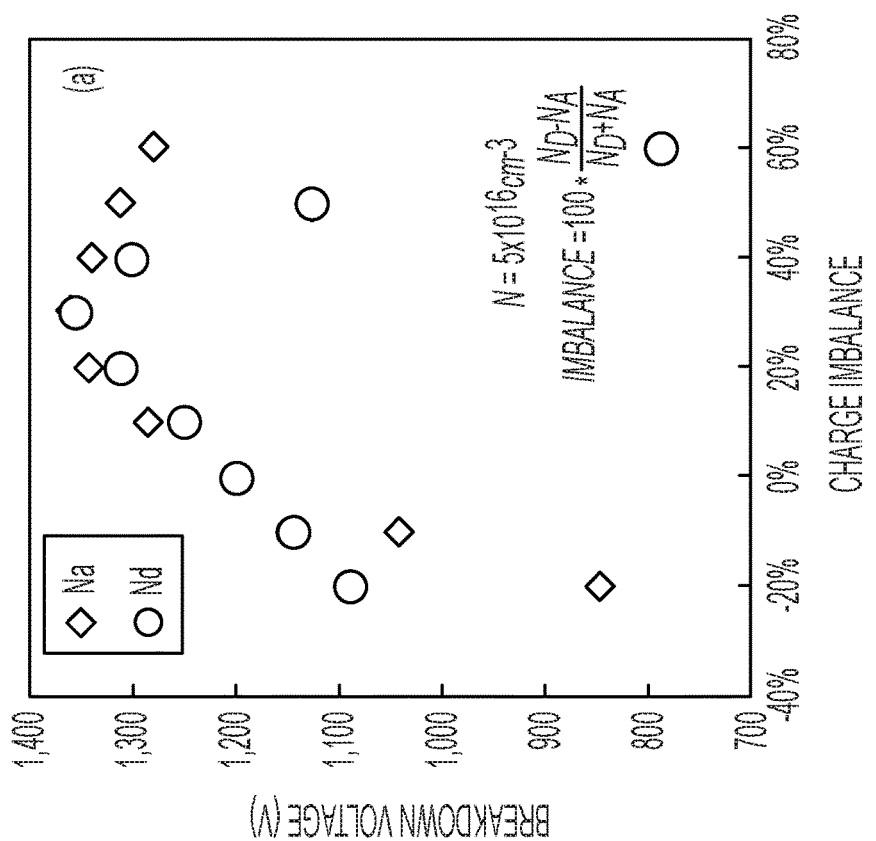
FIG. 13 is a graph of simulated breakdown voltage versus charge imbalance.

Referring now to FIG. 13, a graph of simulated breakdown voltage versus charge imbalance for illustrative superjunction 600 is shown. For FIG. 13, a doping density of N=5E+16 was selected and charge imbalance was determined off of that value. Equation 3 below describes charge imbalance (in percent).

$$\text{Imbalance} = 100 \frac{N_D - N_A}{N_D + N_A} \quad \text{Equation 3}$$

$N_D$ represents doping density of donors in the n-type layer and $N_A$ represents number of acceptors in the p-type layer. FIG. 13 illustrates an increase in breakdown voltage for charge imbalances greater than 0% and less than approximately 50%. Breakdown voltage is shown to peak at charge imbalances of around 30%. Surprisingly, FIG. 13 illustrates that (and FIG. 9 confirms) greater breakdown voltages are obtainable than breakdown voltages of standard GaN, even at lower doping densities. This greater breakdown voltage is obtainable at attainable doping levels for n-type and p-type semiconductors.

Figure 14:
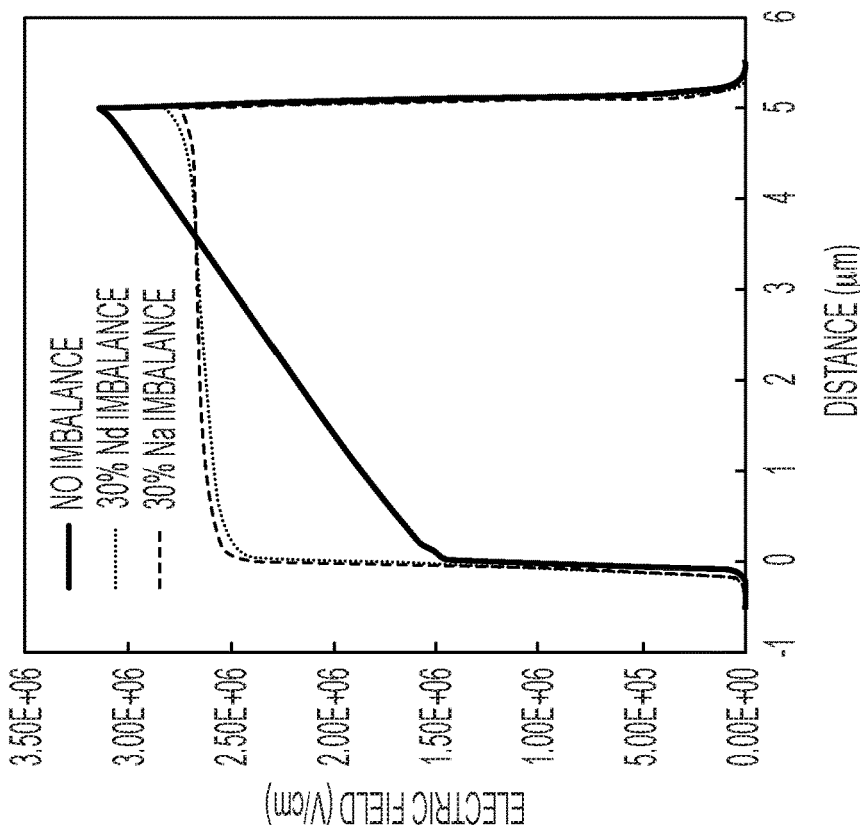
FIG. 14 is a graph comparing electric field versus distance for superjunction devices with different charge imbalances.

Referring now to FIG. 14, a graph comparing electric field versus distance for the superjunction device of FIG. 13 with different charge imbalances is shown. FIG. 14 illustrates that a charge imbalance of around 30% provides a much more consistent and uniform electric field along a length of the superjunction compared to the 0% charge imbalance case. This more uniform electric field is preferable as it should provide longer service life for the superjunction.

Figure 15:
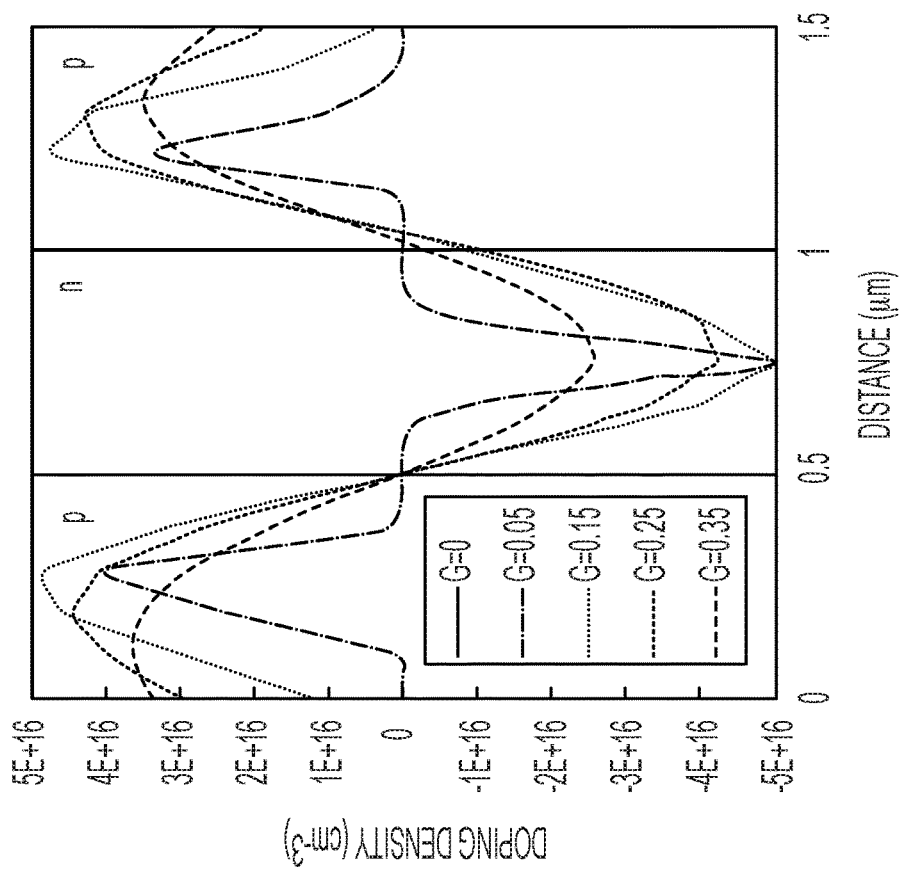
FIG. 15 is a graph of doping density versus distance for different graded profile values.

Referring now to FIG. 15, a graph of doping density versus distance for different graded profile values is shown. FIG. 15 illustrates the effect of diffusion of dopants between layers of n-type and p-type semiconductors. Dopant diffusion often results as a byproduct of the manufacturing process, which subjects the superjunction to high temperatures that provide energy for dopants to diffuse throughout the superjunction. In FIG. 15, G represents a Gaussian distribution of dopant diffusion. At G=0, there is no dopant diffusion between layers and the doping density does not change between layers. At G=0.05, there is some dopant diffusion between layers and the doping density varies through the superjunction. The remaining G values illustrate increased dopant diffusion.

Figure 16:
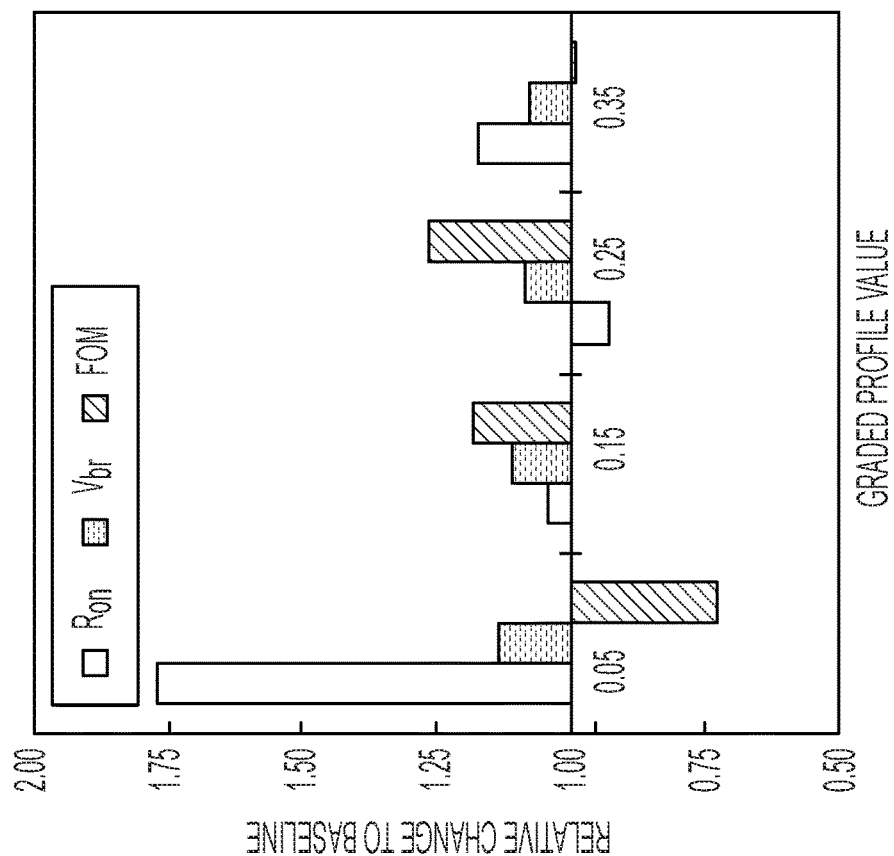
FIG. 16 is a graph of relative charge versus graded profile value for different on-resistances, breakdown voltages, and figures of merit.

Referring now to FIG. 16, a graph of relative charge to baseline versus graded profile value for superjunction of FIG. 15 is shown. FIG. 16 compares relative changes to the G=0 plot of FIG. 15 to G values of 0.05, 0.15, 0.25, and 0.35, where G is the standard deviation of a Gaussian distribution in microns. At G=0.05, on-state resistance has increased significantly, which is not desirable as it lowers superjunction efficiency. Breakdown voltage has increased around twelve percent, but the resulting FOM has decreased around twenty five percent. At G=0.15, on-state resistance has increased slightly, but significantly less than at G=0.05. Breakdown voltage has increased around twelve percent and FOM increased around twenty percent. At G=0.25, on-state resistance actually decreases around ten percent, which is very desirable. Breakdown voltage has increased around ten percent and FOM has increased over twenty five percent. At G=0.35, on-state resistance has again increased around twenty percent. Breakdown voltage increased slightly and FOM decreased slightly. The value of G=0.25 showed the greatest performance characteristics with decreased on-state resistance, increased breakdown voltage, and increased FOM compared to the G=0 case.

Figure 17:
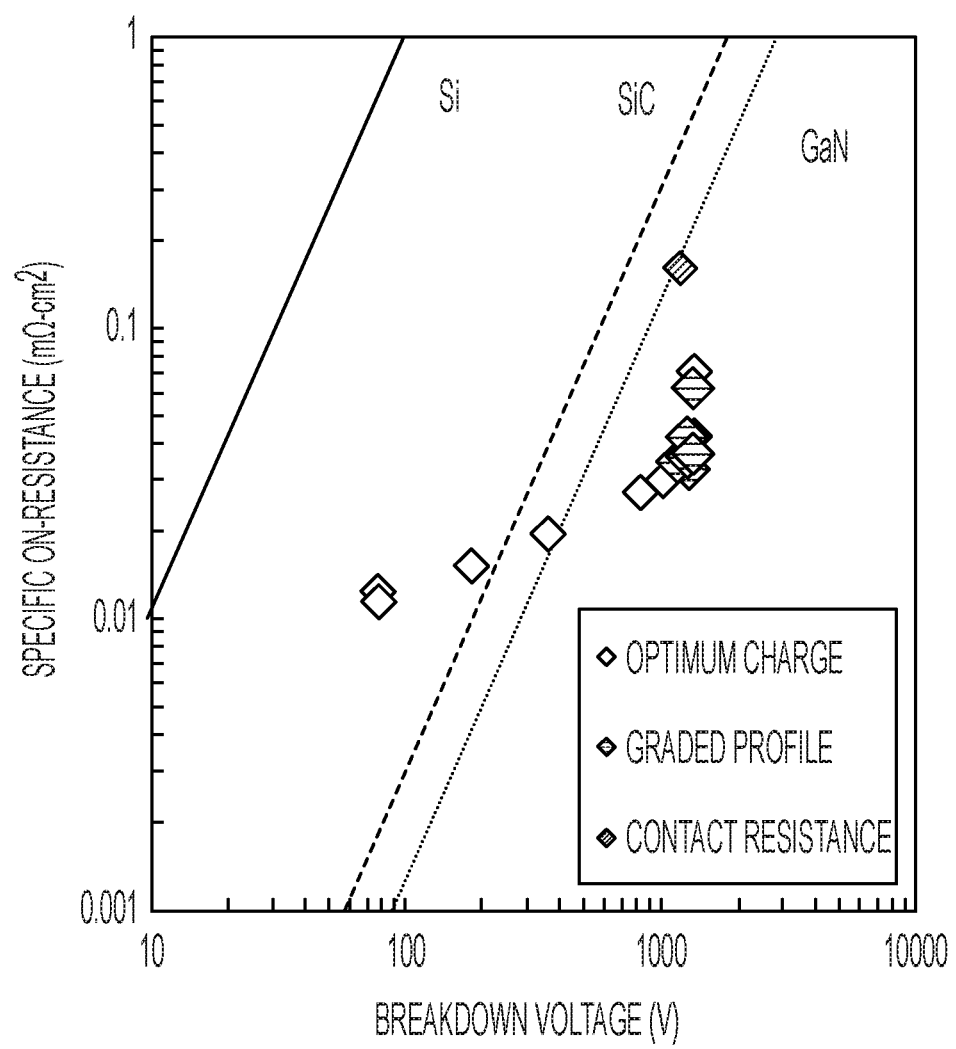
FIG. 17 is a graph of specific on-resistance versus breakdown voltage.

Referring now to FIG. 17, a graph of specific on-resistance versus breakdown voltage is shown. FIG. 17 compares the data of FIG. 16 with the data of FIG. 8 to show the impact of dopant diffusion and charge imbalance on performance of the superjunction. The optimum charge data points illustrate an ideal case without dopant diffusion and charge imbalance. The graded profile data points illustrate the performance of the superjunction with dopant diffusion and charge imbalance. The graded profile data points illustrate that performance of the superjunction still exceeds GaN alone. The contact resistance data point shows the effect on superjunction performance of the losses caused by contact resistance.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, the processes described herein can be embodied within a form that does not provide all of the features and benefits set forth herein, as some features can be used or practiced separately from others. The scope of protection is defined by the appended claims rather than by the foregoing description. All changes which come within the meaning and range of equivalency of the claims are to be embraced within their scope.

What is claimed is:

1. A method of making a lateral super junction, the method comprising:
   depositing a nucleation layer on a substrate;
   forming a trench in the nucleation layer that exposes a portion of the substrate;
   growing a first layer of semiconductor and a second layer of semiconductor, wherein the first layer of semiconductor is grown in the trench and contacts the substrate;

etching a portion of the first layer of semiconductor and the second layer of semiconductor;

placing a mask over the etched first and second layers of semiconductors, wherein the mask does not cover end portions of the first and second layers of semiconductors;

growing a first end layer of semiconductor and a second end layer of semiconductor, wherein the first end layer of semiconductor is adjacent to a first end of the first layer of semiconductor and a first end of the second layer of semiconductor, and wherein the second end layer of semiconductor is adjacent to a second end of the first layer of semiconductor and a second end of the second layer of semiconductor; and performing ohmic contact metallization to the first end layer of semiconductor and the second end layer of semiconductor to form ohmic contact layers.

2. The method of claim 1, wherein the substrate comprises at least one of silicon and sapphire.

3. The method of claim 1, wherein the nucleation layer comprises at least one of AlN, InN, and GaN.

4. The method of claim 1, wherein the substrate comprises bulk GaN.

5. The method of claim 1, wherein, after the etching, the second layer of semiconductor is stacked on top of the first layer of semiconductor.

6. The method of claim 1, wherein, after the etching, the first layer of semiconductor and the second layer of semiconductor are positioned next to one another in a side by side position.

7. The method of claim 1, wherein the first layer of semiconductor and the first end layer of semiconductor comprise p-type semiconductors and the second layer of semiconductor and second end layer of semiconductor comprise n-type semiconductors.

8. The method of claim 1, wherein the ohmic contact layers comprise at least one of Al, Ti, Ni, Au, and Ta.

* * * * *